United States Patent
Kim et al.

(10) Patent No.: US 10,480,771 B1
(45) Date of Patent: Nov. 19, 2019

(54) MANUFACTURING METHOD OF CARBON NANOTUBE COMPOSITE FOR HEAT DISSIPATION AND LED LIGHT THEREWITH

(71) Applicant: INSUNG ENPLA CO.,LTD., Incheon (KR)

(72) Inventors: Sung-Jin Kim, Seoul (KR); Tae-Shik Youn, Seoul (KR)

(73) Assignee: INSUNG ENPLA CO., LTD., Incheon (KR)

( * ) Notice: Subject to any disclaimer, the term of this patent is extended or adjusted under 35 U.S.C. 154(b) by 0 days.

(21) Appl. No.: 16/141,847

(22) Filed: Sep. 25, 2018

(51) Int. Cl.
| | |
|---|---|
| *F21V 29/87* | (2015.01) |
| *F21V 29/70* | (2015.01) |
| *H01L 33/64* | (2010.01) |
| *C01B 32/16* | (2017.01) |
| *F21Y 115/10* | (2016.01) |

(52) U.S. Cl.
CPC .............. *F21V 29/87* (2015.01); *C01B 32/16* (2017.08); *F21V 29/70* (2015.01); *H01L 33/641* (2013.01); *C01B 2202/24* (2013.01); *F21Y 2115/10* (2016.08)

(58) Field of Classification Search
CPC ......... F21V 29/87; F21V 29/20; C01B 32/16; C01B 2202/24; H01L 33/641; F21Y 2115/10
See application file for complete search history.

(56) References Cited

U.S. PATENT DOCUMENTS

| | | | | |
|---|---|---|---|---|
| 7,670,029 | B1* | 3/2010 | Luo | F21V 15/02 362/249.06 |
| 2012/0194054 | A1* | 8/2012 | Johnston | H01J 7/24 313/46 |
| 2014/0240990 | A1* | 8/2014 | Bae | F21V 29/70 362/294 |
| 2014/0347846 | A1* | 11/2014 | Ahn | F21S 8/036 362/147 |
| 2016/0069622 | A1* | 3/2016 | Alexiou | G06F 1/1656 165/146 |

FOREIGN PATENT DOCUMENTS

KR    20150067017 A   *  6/2015

* cited by examiner

*Primary Examiner* — Joseph L Williams
*Assistant Examiner* — Jose M Diaz
(74) *Attorney, Agent, or Firm* — Umberg Zipser LLP

(57) ABSTRACT

The present invention relates to a method for preparing a carbon nanotube-based heat-dissipating material and an LED lighting device. The LED lighting device comprises second LED substrates and a heat-dissipating frame. The heat-dissipating frame comprises: a frame body formed in a polygonal column shape being open at its upper and lower ends, in which substrate contact surfaces, with which the second LED substrates respectively come into contact, are formed on outer sides of the frame body; and auxiliary heat sinks made of a carbon nanotube-based heat-dissipating material and attachably and detachably provided on inner sides corresponding to the substrate contact surfaces of the frame body.

10 Claims, 12 Drawing Sheets

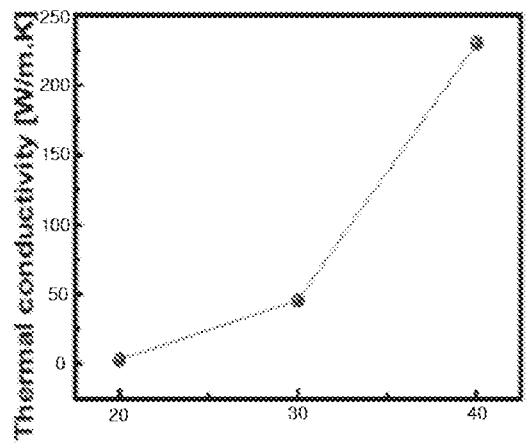
FIG. 6
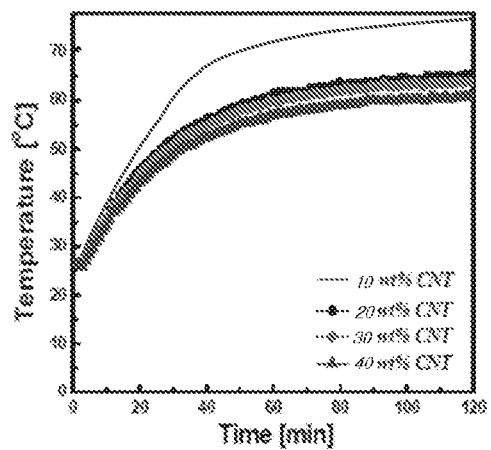
FIG. 7
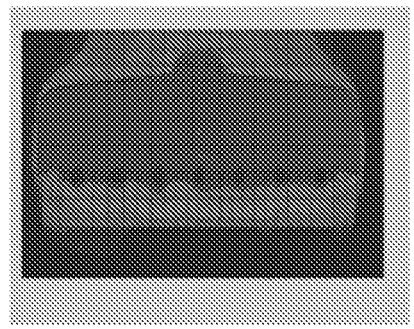 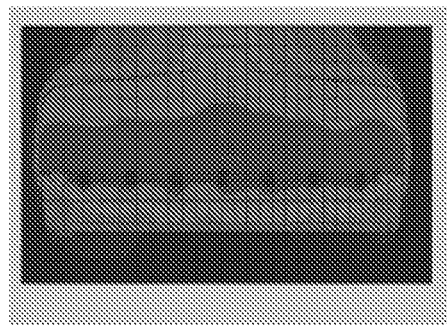
FIG. 8(a)  FIG. 8(b)

MANUFACTURING METHOD OF CARBON NANOTUBE COMPOSITE FOR HEAT DISSIPATION AND LED LIGHT THEREWITH

BACKGROUND OF THE INVENTION

Field of the Invention

The present invention relates to a method for preparing a carbon nanotube-based heat-dissipating material and a light-emitting diode (LED) lighting device comprising the heat-dissipating material, and more particularly to a method for preparing a carbon nanotube-based heat-dissipating material and an LED lighting device comprising the heat-dissipating material, in which the carbon nanotube-based heat-dissipating material may be used to make a heat sink, thereby reducing the production cost while increasing the heat dissipation efficiency of the heat sink compared to a conventional aluminum heat sink, and makes it possible to maximize the heat dissipation efficiency of a heat-dissipating frame by simple structural modification of the frame.

Moreover, the present invention relates to an LED lighting device, and more particularly to an LED lighting device which shows maximized heat dissipation efficiency through simple structural modification and, at the same time, has improved assembly characteristics, thus facilitating component replacement, and also which improves the uniformity of light.

Description of the Prior Art

Generally, a lighting device is a device that emits light by converting light energy into electrical energy. With the development of lighting infrastructure and the diversification of lighting applications, 20% of the total electricity is being consumed for lighting purposes, and thus various studies on high-luminance lighting with high energy efficiency have been conducted.

In particular, LED lighting devices have advantages in that they can save energy resources due to their low power consumption and are environmentally friendly materials that can reduce the emission of waste such as mercury and greenhouse gas ($CO_2$), and in that they can produce various colors and lights and have a long life span. Due to these advantages, these LED lighting devices have been widely used as light source elements for various lighting lamps.

However, these LED lighting devices have a disadvantage in that, because they emit highly bright light from a small element, they generate local heat in the element. In particular, when LED chips are installed densely due to the recent trend of miniaturization and integration of products, a problem arises in that the circuit does not operate normally due to the heat generated when light is emitted from the LED, or in that the LED life is shortened and the LED illuminance is lowered.

Namely, when the LED lighting device fails to properly dissipate the heat generated when light is emitted from the LED, the characteristic performance and life span thereof are significantly adversely affect. For this reason, various studies have been conducted to maximize heat dissipation efficiency.

Accordingly, the applicant of the present invention conducted studies on a heat-dissipating frame capable of increasing heat dissipation efficiency and got patents for the heat-dissipating frame (see Korean Patent No. 10-1147962, entitled "LED lighting device", Korean Patent No. 10-1239123, entitled "LED lighting device", Korean Patent No. 10-1256865, entitled "LED lamp for lighting", and Korean Patent No. 10-1200309, entitled "LED lighting device"). These LED lighting devices are configured such that LED modules are mounted on a substrate contact surface formed on a surface having various angles, thereby improving the uniformity of light. In addition, these LED lighting devices are configured such that the ventilation portion of the heat-dissipating frame protrudes toward the outside of a diffusion cover so that the ventilation portion can be exposed to air in order to ensure that heat exchange can actively occur, thereby maximizing heat dissipation efficiency.

However, these LED lighting devices have a disadvantage in that the weight and volume of the products excessively increase due to the high specific gravity of aluminum so that the products have a desired heat dissipation effect, and for this reason, they do not satisfy miniaturization and integration which are recent trends.

In addition, the above-described LED lighting devices have a problem in that the frame is made of highly expensive aluminum that increases the production cost of the product.

In order to solve these problems, the applicant of the present invention filed a patent application for a heat-dissipating frame comprising carbon nanotubes, and got a patent for the heat-dissipating frame.

FIG. 1 is a perspective view showing a heat-dissipating frame disclosed in Korean Patent No. 10-1783392 (entitled "Method for preparing carbon nanotube-based heat-dissipating material and heat-dissipating frame for lighting device comprising the same").

The heat-dissipating frame (hereinafter referred to as conventional art) 100 shown in FIG. 1 comprises a heat-dissipating plate 101, a heat-dissipating body 103, and heat-dissipating assemblies 105.

The heat-dissipating plate 101 is formed as a disc in which a through-hole that passes through both sides is formed in the center.

The heat-dissipating body 103 is formed in a cylindrical shape which is open at its upper and lower ends and has an air passage hole formed therein. On the outer surface of the heat-dissipating body 103, guide grooves are formed inward, which extends in the vertical direction and are spaced along a circular arc. In addition, the heat-dissipating body 103 is mounted vertically on one side of the heat-dissipating plate 101 such that the air passage hole is connected to the through-hole of the heat-dissipating plate 101.

The heat-dissipating assemblies 105 each comprises: a contact plate with which an LED substrate 111 having LED modules 112 mounted thereon comes in contact; a plate-shaped support vertically connected to one side of the contact plate; and an insertion portion vertically connected to the end of the support and configured to be slidably inserted into the corresponding guide groove.

The conventional art 100 configured as described above has an advantage in that, because the material of the heat-dissipating body 103 and the heat-dissipating assemblies 105 is replaced with a carbon nanotube-based heat-dissipating material, not conventional aluminum, the thermal conductivity, heat release rate and heat release efficiency can be significantly increased.

However, the conventional art 100 has a disadvantage in that, because the heat-dissipating body 103 and the heat-dissipating assemblies 105 are made of the expensive carbon nanotube-based heat-dissipating material, the production cost is increased.

Generally, carbon nanotubes (CNTs) have a disadvantage in that performance thereof is reduced due to modification of the polymer material with the passage of time or upon continued heating, indicating that they have poor long-term stability.

However, the conventional art 100 does not consider this characteristic of carbon nanotubes at all, and has disadvantages in that, because the heat-dissipating body 103 and the heat-dissipating assemblies 105 are all made of the carbon nanotube-based heat-dissipating material, the long-term stability thereof is poor, and when the long-term stability of these components, the corresponding components should be replaced one by one, and for this reason, the assembly characteristics are poor and the component replacement cost increases.

SUMMARY OF THE INVENTION

The present invention has been made in order to solve the above-described problems, and it is an object of the present invention to provide a method for preparing a carbon nanotube-based heat-dissipating material and an LED lighting device comprising the same, which may significantly increase thermal conductivity, heat release rate and heat release efficiency by replacing the material of a heat sink and auxiliary heat sinks with the carbon nanotube-based heat-dissipating material, not conventional aluminum.

Another object of the present invention is to provide a method for preparing a carbon nanotube-based heat-dissipating material and an LED lighting device comprising the same, in which the carbon nanotube-based heat-dissipating material is prepared by crushing a highly thermally conductive carbon composite material and metal powder into fine particles and mixing them through a first ball milling step and a second ball milling step and ensuring the dispersibility of the carbon composite material through a dispersion step, and thus may have higher thermal conductivity than conventional aluminum and, at the same time, may induce lightweight production by reducing volume and weight and may reduce the production cost.

Still another object of the present invention is to provide a method for preparing a carbon nanotube-based heat-dissipating material and an LED lighting device comprising the same, which may maximize the heat dissipation area of a frame body through structural modification and, at the same time, may induce natural convection, thereby efficiently dissipating the heat generated from LED modules.

Still another object of the present invention is to provide a method for preparing a carbon nanotube-based heat-dissipating material and an LED lighting device comprising the same, in which the LED lighting device is configured such that auxiliary heat sinks made of the carbon nanotube-based heat-dissipating material are attachable to and detachable from the inner side of a frame body, and thus the heat dissipation effect can be maintained over a long period of time by simply replacing only the auxiliary heat sinks without disassembling other components.

Still another object of the present invention is to provide a method for preparing a carbon nanotube-based heat-dissipating material and an LED lighting device comprising the same, which may improve the uniformity of light by forming a front diffusion cover into a curved surface.

Yet another object of the present invention is to provide a method for preparing a carbon nanotube-based heat-dissipating material and an LED lighting device comprising the same, which may further improve the heat dissipation effect by forming discharge grooves on the upper side of a heat sink so as to extend to the outer side.

To achieve the above objects, the present invention provides an LED lighting device comprising second LED substrates and a heat-dissipating frame, wherein the heat-dissipating frame comprises: a frame body formed in a polygonal column shape being open at its upper and lower ends, in which substrate contact surfaces, with which the second LED substrates respectively come into contact, are formed on outer sides of the frame body; and auxiliary heat sinks made of a carbon nanotube-based heat-dissipating material and attachably and detachably provided on inner sides corresponding to the substrate contact surfaces of the frame body.

In the present invention, the frame body further comprises: a through-hole portion formed in a cylindrical shape being open at its upper and lower end and having a through-hole formed therein, the through-hole portion being formed vertically in the center of the internal space of the frame body; and reinforcing walls connecting each inner side of the frame body to the outer circumferential surface of the through-hole portion and extending vertically, wherein an 'U'-shaped heat-dissipating wing that extends vertically is formed to protrude on one side of the auxiliary heat sinks, which faces toward the through-hole portion when assembled.

In the present invention, auxiliary heat sink insertion grooves are formed on each inner side of the frame body such that they are formed outward from the inner side, extend to the upper end and lower end of the frame body, and are opposite to each other in the widthwise direction; the auxiliary heat sink insertion grooves of the frame body are formed outward from the inner side of the frame body such that the ends thereof extend so as to form extension grooves; and each of the auxiliary heat sinks comprises: a fixing member formed in a bar shape having a length such that the heat-dissipating wing is formed to protrude on one side of the fixing member and the fixing member is slidably inserted into the auxiliary heat sink insertion groove of the frame body in an up-to-down direction when assembled; and insertion members extending laterally from both sides adjacent from the other side of the fixing member and configured to be inserted into the respective extension grooves of the auxiliary heat sink insertion grooves of the frame body.

In the present invention, the LED lighting device further comprises: a heat sink coupled to the lower end of the frame body at its upper side and configured to dissipate heat; and a base coupled to the lower end of the heat sink, wherein the heat sink has a plurality of discharge grooves formed on the upper side thereof, the discharge grooves being formed inward from the upper side and extending to the outer lateral surface.

In the present invention, the heat sink and the auxiliary heat sinks are made of a carbon nanotube-based heat-dissipating material, and a method for preparing the carbon nanotube-based heat-dissipating material comprises: a stirring step of stirring 70 to 90 wt % of metal powder and 10 to 30 wt % of a carbon composite material; a ball milling step of mixing the metal powder and carbon composite material, stirred in the stirring step, with an organic solvent, followed by ball milling; and a heat treatment and dispersion step of mixing a crushed material comprising fine particles, obtained in the ball milling step, with polyethylene glycol (PEG) and a polyester-based binder, thus obtaining a mixture, and blending the mixture while heating, thereby preparing the heat-dissipating material, wherein the ball milling step comprises: a first ball milling step of supplying the metal powder and carbon composite material, stirred in the stirring step, to a ball mill jar containing balls, followed by rotation at a speed of 200 to 250 rpm, thereby crushing the stirred metal powder and carbon composite material; and a second ball milling step of further crushing the crushed material, obtained in the first ball milling step, by rotation at a speed of 200 to 250 rpm by use of balls having a smaller diameter than the balls used in the first ball milling step, wherein the first ball milling step and the second ball milling step comprise mixing 15 to 20 wt % of the mixture of the metal powder and the carbon composite mixture and 80 to 85 wt % of an organic solvent, followed by milling, and stearic acid for promoting dispersion of the carbon composite material is added in an amount of 1.5 to 2.5 wt % based on the total weight in the ball milling step.

In the present invention, the heat treatment and dispersion step comprises heating the polyethylene glycol (PEG) while rotating it at a speed of 50 to 70 rpm for a predetermined time, and adding the crushed material and the polyester-based binder to the heated polyethylene glycol (PEG), and then heating the mixture while rotating it; the heating temperature in the heat treatment and dispersion step is the melting temperature of the polyethylene glycol (PEG), and the volume fraction of the polyethylene glycol (PEG) and the metal powder is 4, and the volume fraction of the carbon composite material-PEG precursor is 6; the first ball milling step comprises performing a process for a time period of 1 hour, and then stopping the process for 30 minutes, and the process that is performed for a time period of 1 hour is repeated four times; and the second ball milling step comprises performing a milling process for about 3 to 5 hours.

In the present invention, the carbon composite material is single-walled carbon nanotubes (SWCNTs), double-walled carbon nanotubes (DWCNTs), multi-walled carbon nanotubes (MWCNTs), rope carbon nanotubes, or a combination thereof, and the polyethylene glycol that is used in the heat treatment and dispersion step has a molecular weight of 15,000 to 20,000.

In the present invention, passage holes, which are formed inward from the outer side and connected to the internal space of the frame body, are respectively formed in extensions between the adjacent substrate contact surfaces of the frame body; the passage holes are formed such that they are respectively connected to the adjacent substrate contact surfaces and extend vertically to the upper end and lower end of the frame body, and thus the adjacent substrate contact surfaces are spaced apart from each other by the passage holes; and plate-shaped auxiliary extensions are formed to protrude in the respective extensions of the frame body such that they protrude outward from the lateral side of each of the adjacent substrate contact surfaces, extend vertically, and are spaced apart from each other so as to externally expose the corresponding passage hole.

In the present invention, at least one bolt hole is formed in the fixing member, and a bolt groove corresponding to the bolt hole of the auxiliary heat sink is formed on the inner sides of the frame body, and thus the frame body and the auxiliary heat sink are fixed by bolt locking; sliding grooves are formed on both sides of the substrate contact surfaces of the frame body such that both sides of the second LED substrates are slidably inserted therein; the LED lighting device further comprises second diffusion covers configured to emit light from the second LED substrate, which are inserted in the sliding grooves of the substrate contact surfaces and come in contact with the substrate contact surfaces; the LED lighting device comprises a power supply device placed in the base; the power supply device comprises a main power supply module configured to supply power to the second LED substrates, and an auxiliary power supply module separably connected to the main power supply module by a connector; the auxiliary power supply module is connected in parallel between the output end of the main power supply model and the second LED substrates, and configured to detect ripple of the main power supply module and remove the rippled from the output voltage when the detected ripple is higher than a predetermined reference value; the LED lighting device comprises a first LED substrate disposed on the upper end of the frame body, and a front diffusion cover configured to emit light emitted the first LED substrate; and the front diffusion cover is formed in a spherical shape being open at one side.

BRIEF DESCRIPTION OF THE DRAWINGS

FIG. 6 is a graph showing the thermal conductivities of Examples 1 and 2 and Comparative Example 3.

FIG. 7 is a graph showing the results of measuring the temperature for 2 hours during which light is emitted, after applying Examples 1 and 2 and Comparative Example 2 to LED lamps.

FIG. 8(a) shows the heat dissipation property of a heat sink comprising a conventional aluminum material, and FIG. 8(b) shows the heat dissipation property of a heat sink comprising a carbon nanotube-based heat-dissipating material of the present invention.

DETAILED DESCRIPTION OF THE INVENTION

Hereinafter, embodiments of the present invention will be described with reference to the accompanying drawings.

Figure 1:
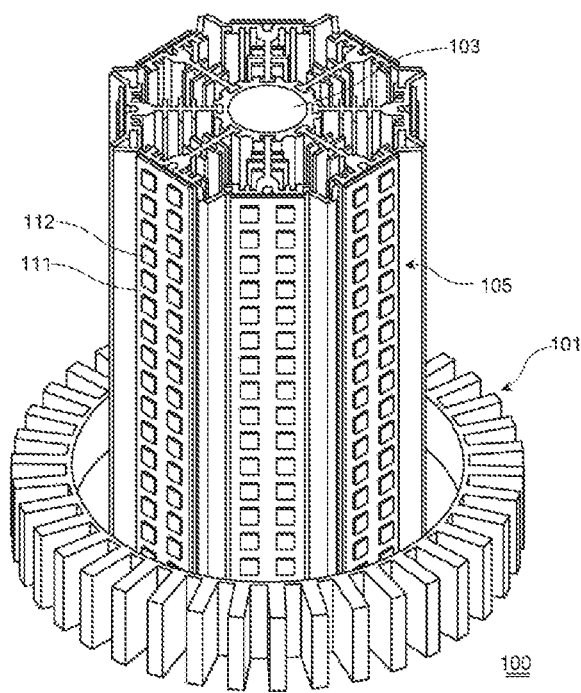
FIG. 1 is a perspective view showing a heat-dissipating frame disclosed in Korean Patent No. 10-1783392 (entitled "Method for preparing carbon nanotube-based heat-dissipating material and heat-dissipating frame for lighting device comprising the same).
Figure 2:
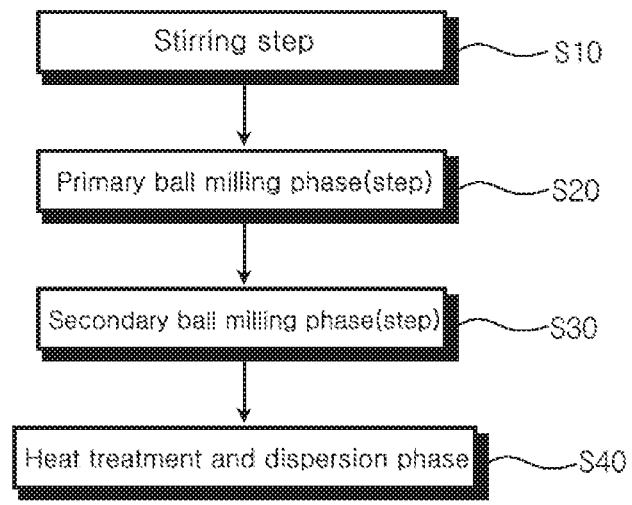
FIG. 2 is a process flow chart showing a method for preparing a carbon nanotube-based heat-dissipating material which is applied to a heat-dissipating frame according to one embodiment of the present invention.

FIG. 2 is a process flow chart showing a method for preparing a carbon nanotube-based heat-dissipating material which is applied to a heat-dissipating frame according to one embodiment of the present invention.

A method (S1) for preparing a carbon nanotube-based heat-dissipating material is directed to a method for preparing the carbon nanotube-based heat-dissipating material, a composition which is applied to the heat sink 4 of an LED lighting device 1 shown in FIGS. 9 to 18, which is configured to release the heat generated during light emission.

Namely, the carbon nanotube-based heat-dissipating material may be applied as a heat-dissipating material which is disposed in a lighting device in order to dissipate the local heat generated from LEDs.

As shown in FIG. 2, the method (S1) for preparing the carbon nanotube-based heat-dissipating material comprises a stirring step (S10), a first ball milling step (S20), a second ball milling step (S30), and a heat treatment and dispersion step (S40).

The stirring step (S10) is a step of stirring 7 to 90 wt % of metal powder and 10 to 30 wt % of a carbon composite material. In this regard, the carbon composite material may be single-walled carbon nanotubes (SWCNTs), double-walled carbon nanotubes (DWCNTs), multi-walled carbon nanotubes (MWCNTs), rope carbon nanotubes, or a combination thereof. Carbon nanotubes (CNTs) are tubular structures composed of interconnected hexagonal shapes having six carbon atoms, and multi-walled carbon nanotubes (MW-CNTs) are concentric cylinders composed of a plurality of tubes.

The metal powder may be metal powder having high thermal conductivity. It may preferably be aluminum powder.

The carbon composite material that is used the stirring step (S10) does not influence the shape of the heat-dissipating material. If the carbon composite is used in an amount of less than 10 wt %, the content of the carbon composite material will excessively decrease, thus reducing thermal conductivity, heat release rate and heat release efficiency, and if the carbon composite material is used in an amount of more than 30 wt %, a problem will arise in that the carbon composite material is difficult to disperse, thus reducing the physical properties of the heat-dissipating material.

The mixture of the metal powder and the carbon composite material, obtained by stirring in the stirring step (S10), is supplied to the first ball milling step (S20).

The first ball milling step (S20) is a step of subjecting mixture of the metal powder and the carbon composite material, obtained by stirring in the stirring step (S10), to a first grinding and crushing process using a known ball milling system.

In the first ball milling step (S20), 15 to 20 wt % of the mixture of the stirred metal powder and carbon composite material and 80 to 85 wt % of an organic solvent are supplied to a ball mill jar which is a pot containing balls, and the metal powder and the carbon composite material are crushed by rotating the ball mill jar at a rotational speed of 200 to 250 rpm. At this time, the organic solvent may be ether, acetone, alcohol or the like. Preferably, the organic solvent is ethanol.

In addition, in the first ball milling step (S20), a dispersion promoter may be added in an amount of 1.5 to 2.5 wt % based on the total weight of the metal powder, the carbon composite material and the organic solvent. At this time, the dispersion promoter is stearic acid having the property of promoting dispersion of the carbon composite material.

Furthermore, in the first ball milling step (S20), the ball milling process is performed for a time period (T) of about 1 hour. Considering the property of ethanol that produces heat upon friction, after the process is performed once, the process is stopped by stopping rotation for about 30 minutes. The process that is performed for a time period (T) of about is repeated 4 to 5 times.

The first crushed material, obtained by first crushing in the first ball milling step (S20), is supplied to the second ball milling step (S30).

The second ball milling step (S30) is a step of more finely crushing the first crushed material, obtained by crushing in the first ball milling step (S20), by means of a known ball milling system.

At this time, balls that are used in the second ball milling step (S30) have a smaller diameter than balls that are used in the first ball milling step (S20).

In the second ball milling step (S30), the first crushed material (metal powder+carbon composite material), obtained by first crushing in the first ball milling step (230), and an organic solvent, are supplied to a ball mill jar containing balls, and then the first crushed material is more finely crushed by rotating the ball mill jar at a rotational speed of 200 to 250 rpm for about 3 to 5 hours.

The second crushed material (metal powder+carbon composite material), obtained by second crushing in the second ball milling step (S30), is supplied to the heat treatment and dispersion step (S40).

The heat treatment and dispersion step (S40) is a step of dispersing and embedding the carbon composite material in the finely crushed metal powder in view of the fact that the carbon composite material of the second crushed material supplied from the second ball milling step (S30) has low dispersibility due to its high cohesiveness and that the carbon composite material is difficult to embed, because the mechanical properties of the carbon composite material differ from those of the metal powder.

In this regard, the embedding is defined as the phenomenon that the carbon composite material adheres to a portion of the metal powder whose surface became amorphous during fine crushing in the first and second ball milling steps (S20) and (S30).

In the heat treatment and dispersion step (S40), polyethylene glycol (hereinafter referred to as PEG) is used as a solvent for mixing of the metal powder and carbon composite material of the second crushed material supplied from the second ball milling step (S30).

In this regard, the polyethylene glycol (PEG) is a polyethylene glycol having a molecular weight of about 15,000 to 20,000.

In addition, the heat treatment and dispersion step (S40), a polyester-based binder is added in order to increase the viscosity of the mixture.

In addition, in the heat treatment and dispersion step (S40), the polyethylene glycol (PEG) is first heated for about 20 minutes to a temperature of 65 to 75° C., which is the melting point of the polyethylene glycol (PEG), while it is rotated at a speed of 50 to 70 rpm by means of a known twin screw mixer. Then, the second crushed material (metal powder+carbon composite material) and the polyester-based binder are added to the heated polyethylene glycol (PEG), and the resulting mixture (PEG+metal powder+carbon composite material+polyester based binder) is heated to a temperature of 65 to 75° C. for 30 minutes while it is rotated at a speed at a speed of 50 to 70 rpm.

Namely, in the heat treatment and dispersion step (S40), blending is performed while melting the compound such that the carbon composite material is uniformly dispersed and embedded in the metal powder, thereby preparing the carbon nanotube-based heat-dissipating material of the present invention.

In the heat treatment and dispersion step (S40), it is preferred that the volume fraction of the polyethylene glycol (PEG) and the metal powder is 4 and the volume fraction of the carbon composite-PEG precursor is 6.

The carbon nanotube-based heat-dissipating material prepared by the process of FIG. 2 as described above comprises the metal powder, the carbon composite material, the binder and the PEG. When the carbon nanotube-based heat-dissipating material is heated for processing during production of a heat sink, the binder is burned out and the PEG is evaporated out, leaving fine pores. Through these pores, high-temperature heat is released from the LED heat-dissipation structure, thus increasing heat dissipation efficiency.

Example 1 is a heat-dissipating structure made of a heat-dissipating material obtained by adding 20 wt % of carbon nanotubes (CNTs) and 80 wt % of aluminum powder in the stirring step (S10) of FIG. 2.

Example 2 is a heat-dissipating structure made of a heat-dissipating material obtained by adding 30 wt % of carbon nanotubes (CNTs) and 70 wt % of aluminum powder in the stirring step (S10).

Comparative Example 1 is a heat-dissipating structure made of a heat-dissipating material obtained by adding 100 wt % of aluminum powder without adding carbon nanotubes (CNTs) in the stirring step (S10).

Comparative Example 2 is a heat-dissipating structure made of a heat-dissipating material obtained by adding 40 wt % of carbon nanotubes (CNTs) and 60 wt % of aluminum powder in the stirring step (S10).

Figure 3:
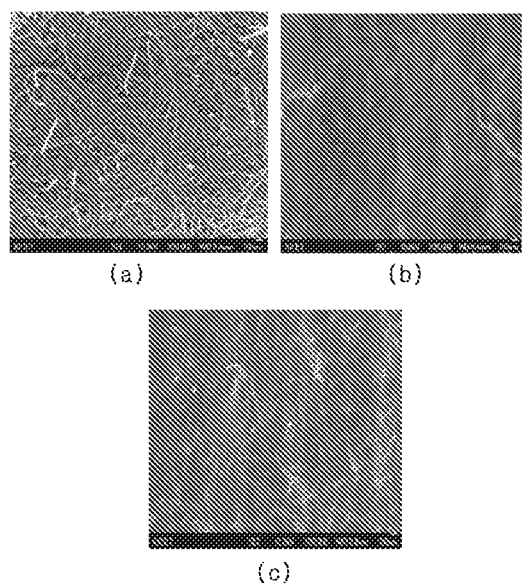
FIG. 3 is a set of SEM (scanning electron microscope) photographs showing the surfaces of Example 1 and Comparative Examples 1 and 2, measured by FESEM (field emission scanning electron microscope) surface analysis.

FIG. 3 is a set of SEM (scanning electron microscope) photographs showing the surfaces of Example 1 and Comparative Examples 1 and 2, measured by FESEM (field emission scanning electron microscope) surface analysis.

As can be seen in FIG. 3(a), Comparative Example 1 obtained by adding 100 wt % of aluminum powder without adding carbon nanotubes (CNTs) in the stirring step (S10) has many defects that occurred in the fracture.

As can be seen in FIG. 3(b), Example 1 obtained by adding 20 wt % of carbon nanotubes (CNTs) and 80 wt % of aluminum powder in the stirring step (S10) has pores that occurred in the fracture due to addition of 20 wt % of carbon nanotubes (CNTs). As can be seen in FIG. 3(c), Comparative Example has more pores that occurred in the fracture due to addition of 40 wt % of carbon nanotubes (CNTs).

In this regard, the pores are formed because the binder is burned out and the PEG is evaporated out, when the heat-dissipating structure sample is made by heating the prepared carbon nanotube-based heat-dissipating material.

Namely, it can be seen that as the content of carbon nanotubes (CNTs) increases, the pores are more actively formed, thus increasing heat dissipation efficiency.

Referring to FIGS. 3(b) and 3(c), it can be seen that as the content of carbon nanotubes (CNTs) increases, the number of carbon nanotubes (CNTs) bound to aluminum powder on the surface of the heat-dissipating structure increases, and the carbon nanotubes (CNTs) are relatively uniformly dispersed.

Figure 4:
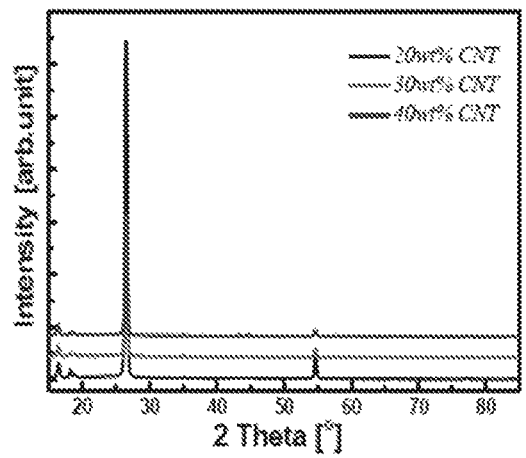
FIG. 4 is a graph showing the results of XRD pattern analysis of Examples 1 and 2 and Comparative Example 1.

FIG. 4 is a graph showing the results of XRD pattern analysis of Examples 1 and 2 and Comparative Example 1.

Referring to FIG. 4, it can be seen that main crystallization of the carbon nanotube-based heat-dissipating material according to the present invention occurs at 2Ø=26.50 and 54.60 and 2Ø=26.50, and as the content of carbon nanotubes (CNTs) increases, the intensity of the crystallization peak of the carbon nanotube-based heat-dissipating material decreases.

In particular, it can be seen that when the carbon nanotube-based heat-dissipating material contains 30 wt % or more of carbon nanotubes (CNTs), the intensity of the major peak greatly decreases, indicating that the content of carbon nanotubes (CNTs) influences the intensity of the peak. Specifically, as the content of carbon nanotubes (CNTs) increases, the intensity of the peak of the heat-dissipating material decreases.

Namely, as shown in FIGS. 3 and 4, the content of carbon nanotubes (CNTs) influences the microstructure, micropores and crystallization of the carbon nanotube-based heat-dissipating material.

Figure 5:
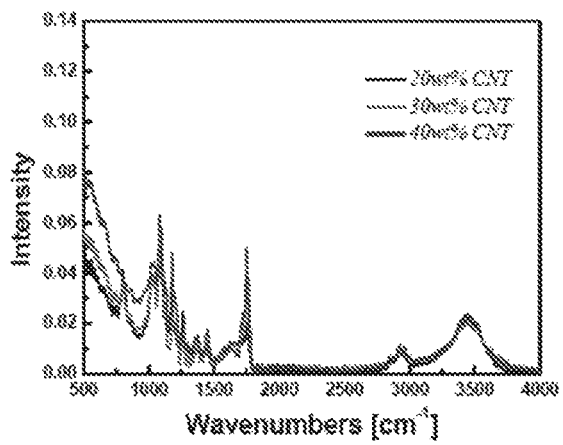
FIG. 5 is a graph showing FT-IR analysis of the structures of Examples 1 and 2 and Comparative Example 3.

FIG. 5 is a graph showing FT-IR analysis of the structures of Examples 1 and 2 and Comparative Example 3.

Referring to FIG. 5, the carbon nanotube-based heat-dissipating materials show similar peak intensities regardless of the content of carbon nanotubes (CNTs).

Moreover, the peaks at 2,937 $cm^{-1}$ and 3,450 $cm^{-1}$ of the carbon nanotube-based heat-dissipating material indicate a typical C—H group and —OH group, respectively, and the peaks at 1,758 $cm^{-1}$ and 1,200 $cm^{-1}$ indicate the peaks of a C=O bond and acetyl, respectively.

In addition, in the FT-IR spectrum, it can be seen that the peaks at 1,266 $cm^{-1}$, 1,369 $cm^{-1}$, 1,446 $cm^{-1}$ and the like increase as the content of carbon nanotubes (CNTs) increases.

Namely, the peak of the heat-dissipating material is determined by the characteristic peak of carbon nanotubes (CNTs), and thus it can be seen that the bonding of carbon nanotubes (CNTs) in the carbon nanotube-based heat-dissipating material increased.

FIG. 6 is a graph showing the thermal conductivities of Examples 1 and 2 and Comparative Example 3; FIG. 7 is a graph showing the results of measuring the temperature for 2 hours during which light is emitted, after applying Examples 1 and 2 and Comparative Example 2 to LED lamps; and FIG. 8(a) shows the heat dissipation property of a heat-dissipating structure comprising a conventional aluminum material, and FIG. 8(b) shows the heat dissipation property of a heat-dissipating structure comprising a carbon nanotube-based heat-dissipating material of the present invention.

Referring to FIG. 6, it can be seen that as the content of carbon nanotubes (CNTs) increases, the thermal conductivity of the carbon nanotube-based heat-dissipating material increases. Namely, it can be seen that the thermal conductivity of the carbon nanotube-based heat-dissipating material is increased due to the excellent thermal conductivity of carbon nanotubes (CNTs).

At this time, since the carbon nanotubes (CNTs) have a thermal conductivity value of about 3,000 W/m·k or lower, they can increase the thermal conductivity of the carbon nanotube-based heat-dissipating material. In addition, the thermal conductivity can also be increased by adjusting the ratio of the content of carbon nanotubes to the content of aluminum powder.

Referring to FIG. 7, the initial temperature measured in the heat-dissipating structures of Examples 1 and 2 and Comparative Example 1 is 27° C., but the temperature increases with the passage of time due to the heat generated from the LED lamp.

After one hour in this state, it can be seen that Comparative Example 1 containing no carbon nanotube (CNT) is overheated to 72° C. or higher.

However, in the case of Examples 1 and 2 and Comparative Example 2, which contain carbon nanotubes (CNTs), the temperature measured for 2 hours is lower than 70° C., indicating that the heat release efficiency is improved.

Namely, as shown in FIGS. 8(*a*) and 8(*b*), the heat-dissipating structure of the present invention may have significantly improved heat release rate and heat release efficiency compared to a conventional heat-dissipating structure made of aluminum, because it contains the carbon composite material having excellent thermal conductivity.

Figure 9:
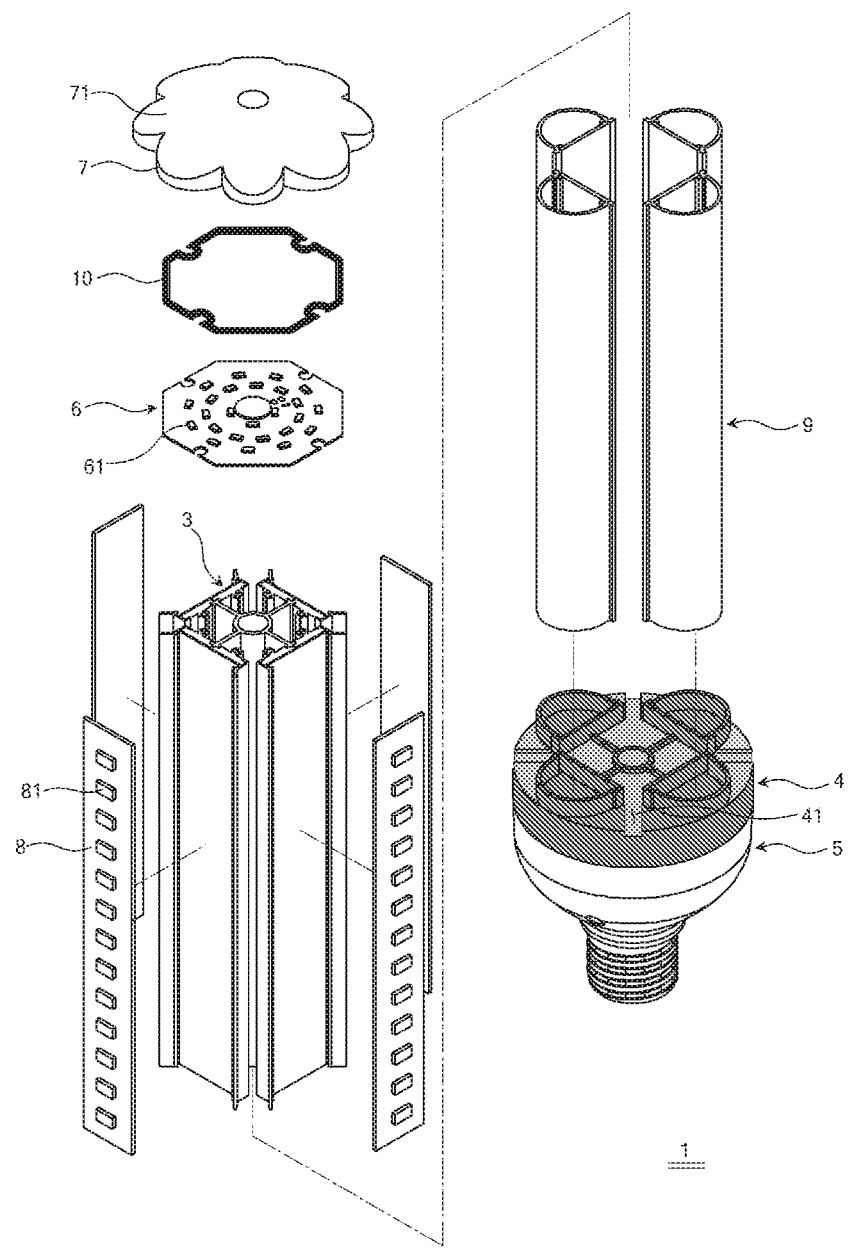
FIG. 9 is an exploded perspective view showing an LED lighting device according to one embodiment of the present invention.

FIG. 9 is an exploded perspective view showing an LED lighting device according to one embodiment of the present invention.

As shown in FIG. 9, an LED lighting device 1 according to one embodiment of the present invention comprises a heat-dissipating frame 3, a heat sink 4, a base 5, a first LED substrate 6, a front diffusion cover 7, second LED substrates 8, side diffusion covers 9, and a packing member 10.

The base 5 is coupled to the bottom of the heat sink 4, has formed at its end a connection portion 51 for connection with an external socket (not shown). Thus, it is configured to supply external power to the LED substrates 6 and 8.

Figure 17:
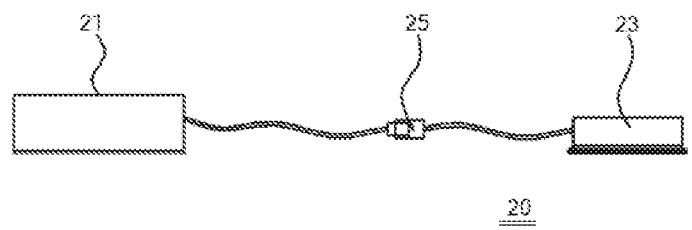
FIG. 17 is a view illustrating a power supply device which is placed in the base of FIG. 9.

In the base 5, a power supply device 20 to be described below with reference to FIG. 17 is disposed.

The heat sink 4 is coupled to the heat-dissipating frame 3 at its upper side and coupled to the base 5 at its lower end.

In addition, on the upper side of the heat sink 4, a plurality of discharge grooves 41 configured to externally release internal heat are formed.

Furthermore, the upper side of the heat sink 4 is formed in a shape corresponding to the shape of the heat-dissipating frame 3 which comes into contact therewith, so that the heat-dissipating frame 3 can be firmly coupled thereto.

In addition, the heat sink 4 is made of the carbon nanotube-based heat-dissipating material shown in FIGS. 2 to 8 as described above, so that the heat dissipation effect thereof can be maximized.

The first LED substrate 6 is a substrate on which a plurality of LED modules 61 is mounted and a circuit for switching on and off the mounted LED modules 61 is printed. The LED modules 61 are configured to emit light upward.

In addition, the first LED substrate 6 is coupled to the upper end of the heat-dissipating frame 3 and configured to emit light upward. Furthermore, a packing member 10 is provided at a coupling portion between the first LED substrate 6 and the heat-dissipating frame 3, so that the water tightness therebetween can be increased.

The front diffusion cover 7 is formed in a hemispherical shape having an opening at one side. The first LED substrate 6 is inserted into the opening, and the front diffusion cover is configured to diffuse the light emitted from the first LED substrate 6.

At this time, the outer surface of the front diffusion cover 7 is formed into a hemispherical curved surface 71, thus improving the uniformity of light.

The second LED substrates 8 are substrates on which a plurality of LED modules 81 is mounted and a circuit for switching on and off the mounted LED modules 81 is printed.

In addition, the second LED substrates 8 are disposed in contact with the respective substrate contact surfaces 313 to be described below with reference to FIG. 10, and thus can emit light laterally at various angles.

The LED modules 81 are configured to emit light laterally.

Figure 10:
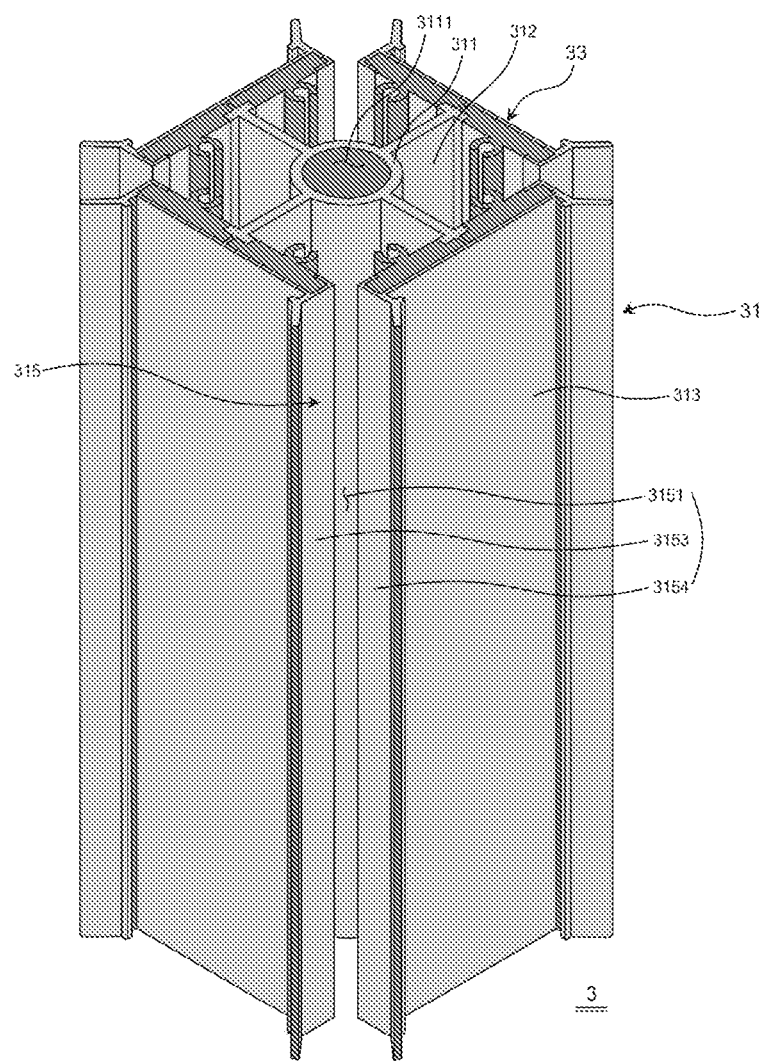
FIG. 10 is a perspective view showing the heat-dissipating frame of FIG. 9.
Figure 11:
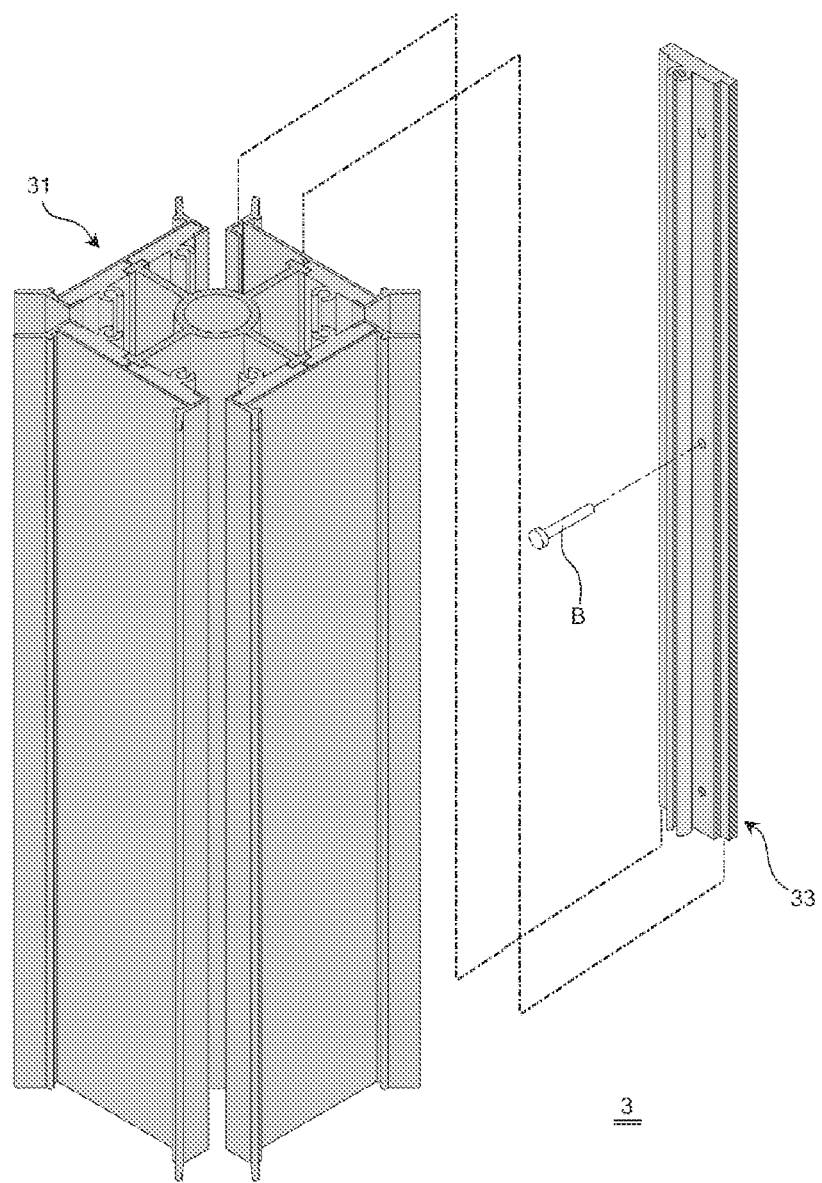
FIG. 11 is an exploded perspective view of a portion of the heat-dissipating frame shown in FIG. 10.

FIG. 10 is a perspective view showing the heat-dissipating frame of FIG. 9; FIG. 11 is an exploded perspective view of a portion of the heat-dissipating frame shown in FIG. 10; and FIG. 12 is a top view of FIG. 10.

Figure 12:
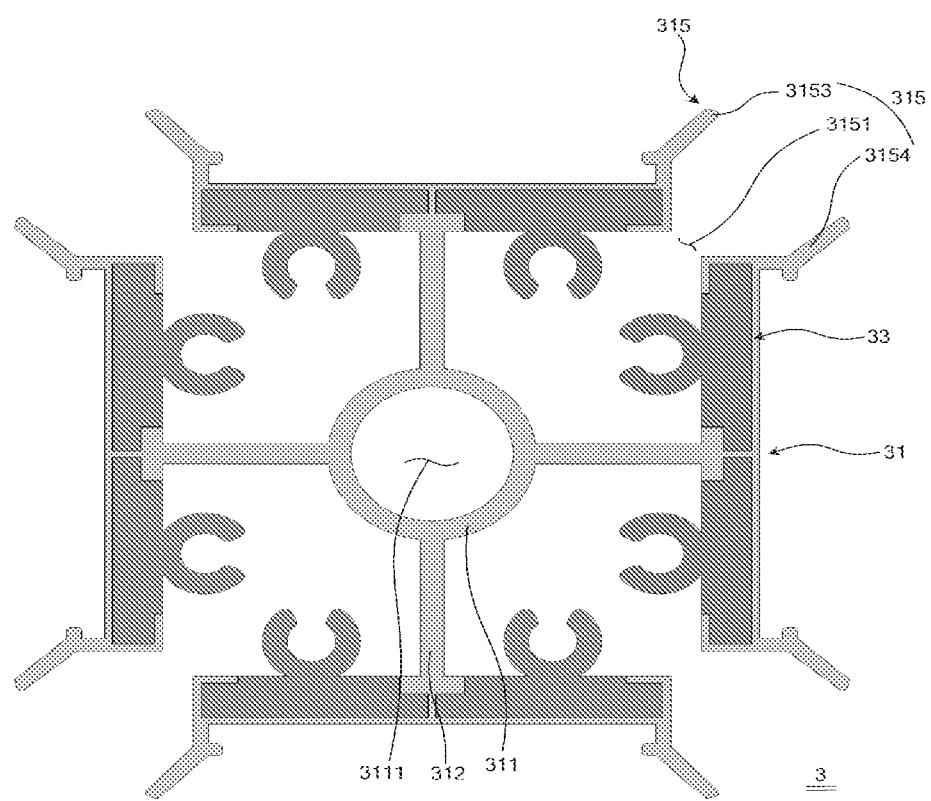
FIG. 12 is a top view of FIG. 10.

As shown in FIGS. 10 to 12, the heat-dissipating frame 3 comprises: a square column-shaped frame body 31 being open at its upper and lower ends and having a space formed therein; and plate-shaped auxiliary heat sinks 33 formed of the carbon nanotube-based heat-dissipating material and coupled to the frame body 31 so as to be attachable to and detachable from the frame body 31.

Figure 13:
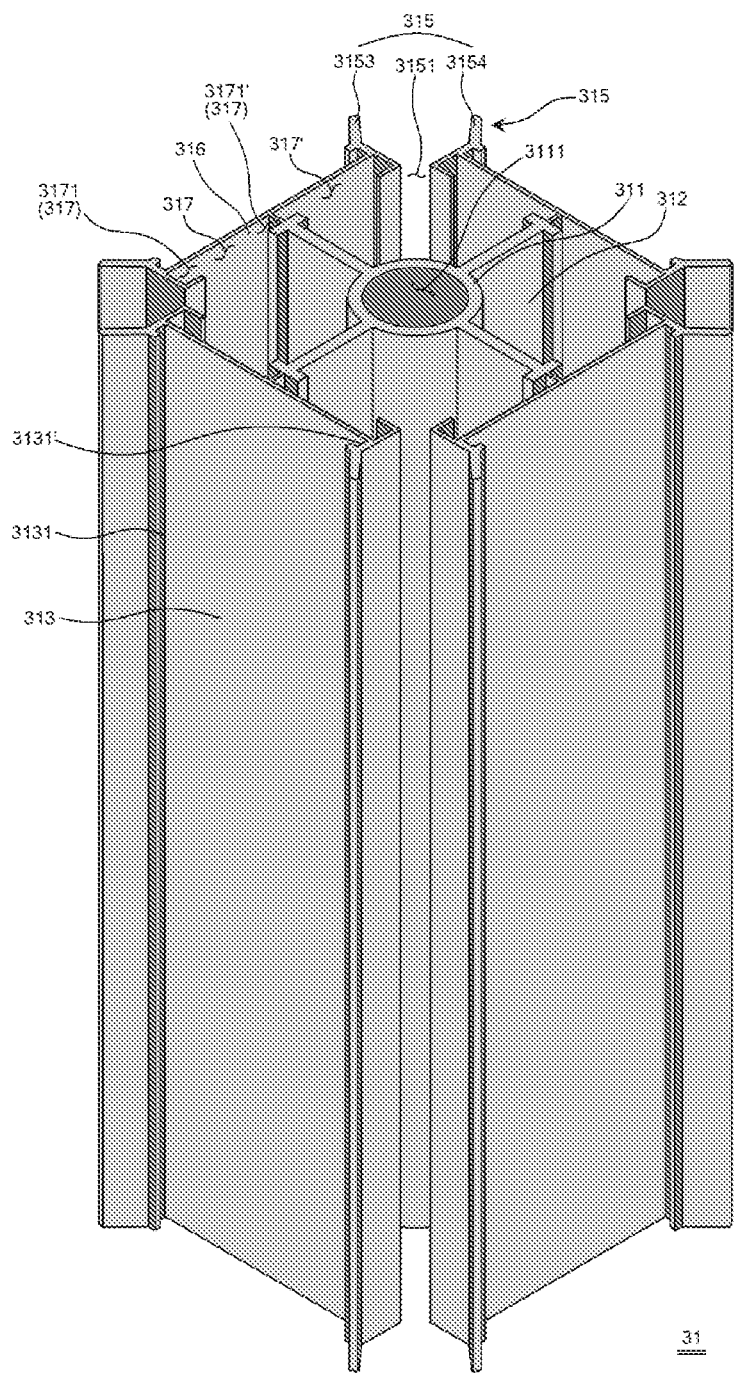
FIG. 13 is a perspective view showing the frame body of FIG. 10.

FIG. 13 is a perspective view showing the frame body of FIG. 10.

As shown in FIG. 13, the frame body 31 is formed in a square column shape being open at its upper and lower ends and having a space formed therein. The lower end of the frame body 31 is coupled to the heat sink 4, while the front diffusion cover 7 and the first LED substrate 6 are coupled to the upper end of the frame body 31.

The frame body 31 includes a through-hole portion 311 which has the same length as the frame body. The through-hole portion 311 is open at its upper and lower ends and has a vertical through-hole 3111 formed therein.

At this time, the through-hole portion 311 and each inner side of the frame body 31 are connected to each other by reinforcing walls 312.

This air-through portion 311 is configured such that cold air is introduced through the lower opening while internal hot air is externally discharged through the upper opening, so that air circulation can be activated, thereby effectively achieving heat exchange and heat dissipation of the heat-dissipating frame 3.

Namely, the through-hole portion 311 may receive heat from the frame body 31 through the reinforcing wall 312, and externally discharge the received heat through the through-hole 3111, thereby increasing heat-dissipation efficiency.

In addition, at each side of the frame body 31, a substrate contact surface 313 is formed which is formed of a flat plate and with which each of the second LED substrates 8 comes into contact. In the present invention, for convenience of explanation, an example is described in which the frame body 31 is formed in a square column shape and has four substrate contact surfaces 313. However, it is to be understood that the shape of the frame body 31 is not limited thereto, but may be a cylindrical shape or a polygonal column shape, and the number of the substrate contact surfaces 313 may correspond to the shape of the frame body 31.

In addition, at both sides of each of the substrate contact surfaces 313, sliding grooves 3131 and 3131' are formed to extend vertically. Both sides of the second LED substrate 8 are slidably inserted into the sliding grooves 3131 and 3131' of the substrate contact surfaces 313 in an up-to-down direction, thereby improving assembly characteristics. At this time, the substrate contact surface 313 and the second LED substrate 8 are disposed such that the facing sides comes into contact with each other. Into the sliding grooves 3131 and 3131' of the substrate contact surface 313 on which the second LED substrate 8 is disposed, both sides of the side diffusion cover 9 are further inserted and coupled.

Furthermore, in extensions 315 between the adjacent substrate contact surfaces 313 of the frame body 31, each passage hole 3151 is formed, which extends inward from the outer side and is connected to the internal space. At this time, the passage holes 3151 are formed between the adjacent substrate contact surfaces 313 so as to extend vertically from the upper end to the lower end, and thus the adjacent substrate contact surfaces 313 of the frame body 31 are spaced apart from each other by the passage holes 3151.

These passage holes 3151 of the extensions 315 can further increase the heat dissipation area of the heat-dissipating frame, thereby increasing heat dissipation efficiency.

Furthermore, in each extension of the frame body 31, auxiliary extensions 3153 and 3154 are formed to protrude outward from each side of the adjacent substrate contact surfaces 313 and to extend vertically. At this time, the auxiliary extension 3153 is formed to be spaced apart from the opposite auxiliary extension 3154, so that the passage hole 3151 extends outward, making air circulation more active.

In addition, on the inner side 316 of the frame body 31, auxiliary heat sink insertion grooves 317 and 317' are formed inward from the inner side 316. The auxiliary heat sink insertion grooves extend vertically from the upper end to the lower end of the frame body 31 and are opposite to each other in the widthwise direction.

In the auxiliary heat sink insertion grooves 317 and 317', extension grooves 3171 and 3171' are formed outward from the inner side 316 of the frame body 31 so as to extend to both sides. To the inner side 316 of the frame body 31 between these extension grooves, a heat dissipation wall 312 is connected vertically.

In addition, into the auxiliary heat sink insertion groove 317, an auxiliary heat sink 33 shown in FIG. 7 is slidably inserted in an up-to-down direction. Thus, periodic replacement of the auxiliary heat sink 33 can be achieved in a simple and rapid manner, in view of the fact that the long-term stability of the carbon nanotube-based heat-dissipating material forming the auxiliary heat sink 33 decreases with the passage of time at high temperature.

Figure 14:
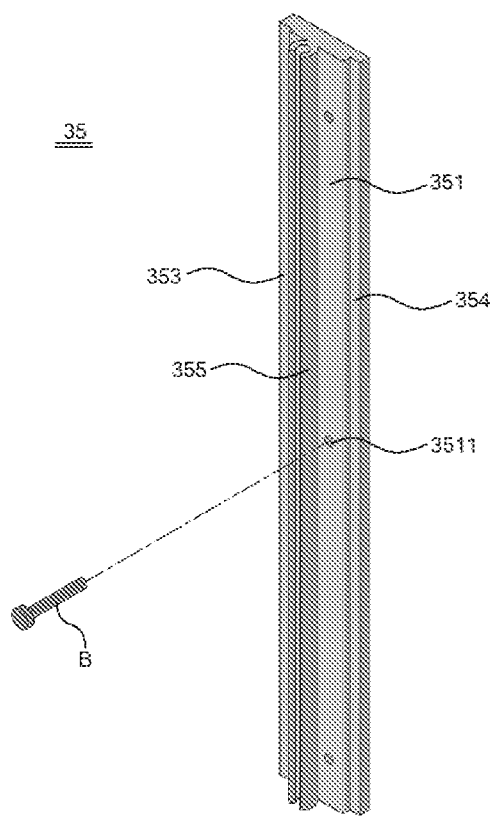
FIG. 14 is a perspective view showing the auxiliary heat sink of FIG. 10.

FIG. 14 is a perspective view showing the auxiliary heat sink of FIG. 10.

The auxiliary heat sink 33 of FIG. 14 is made of the carbon nanotube-based heat-dissipating material described above with reference to FIGS. 2 to 8. It is slidably inserted into the auxiliary heat sink insertion groove 317 of each inner side of the frame body 31 shown in FIG. 13 and comes into contact with the substrate contact surface 313. Thus, the auxiliary heat sink 33 can effectively dissipate the heat transmitted from the second LED substrate through the substrate contact surface 313, and, at the same time, can be periodically replaced.

In addition, the auxiliary heat sink 33 comprises: a bar-shaped fixing member having a length and an area; externally extending insertion members 353 and 354 formed at both sides of the fixing member 351; and an 'U'-shaped heat-dissipating wing 355 formed to protrude from the front side of the fixing member 351 and extend vertically.

At this time, on the front side of the fixing member 351 of the auxiliary heat sink 33, a plurality of bolt holes 3511 is formed. Thus, when the auxiliary heat sink 33 is inserted into the auxiliary heat sink insertion groove 317 of the frame body 31, it can be more firmly coupled to the frame body 31 by locking of a bolt (B).

In addition, when the auxiliary heat sink 33 is assembled, the fixing member 351 is inserted into the auxiliary heat sink groove 317 of the frame body 31, and the insertion members 353 and 354 are inserted into the extension grooves 3171 and 3171' of the heat sink insertion groove 317. Thus, even if external shocks and vibrations occur, the insertion members 353 and 354 can be supported by the side wall forming the extension grooves 3171 and 3171', so that the auxiliary heat sink 33 can be firmly fixed to the frame body 31.

Figure 15:
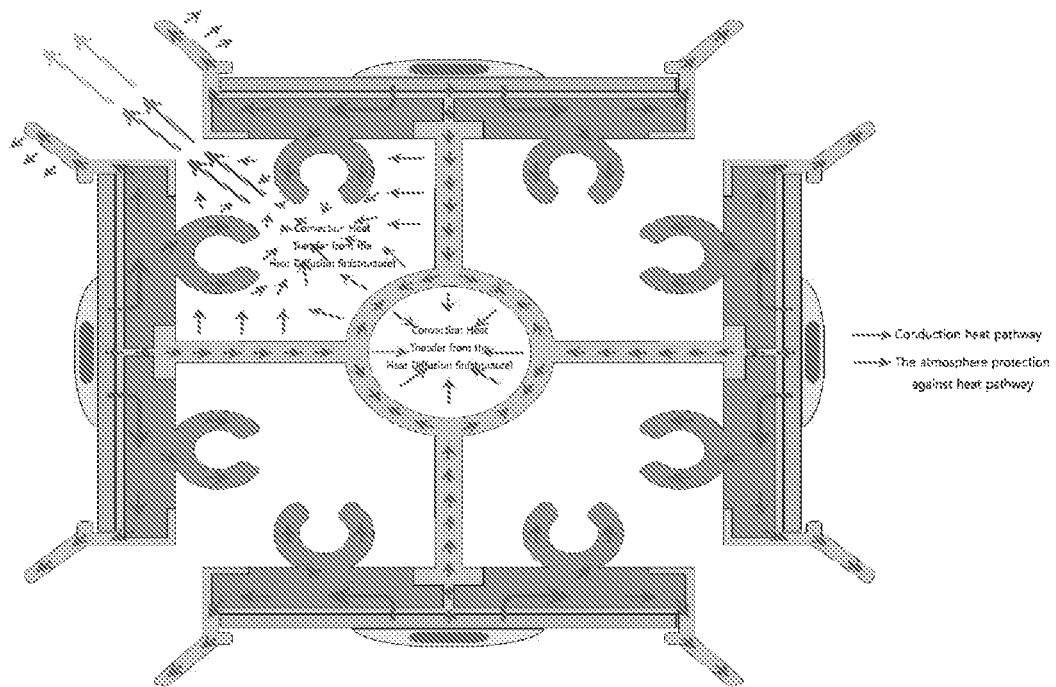
FIG. 15 is a top view illustrating the heat dissipation structure of the heat-dissipating frame of FIG. 10.
Figure 16A:
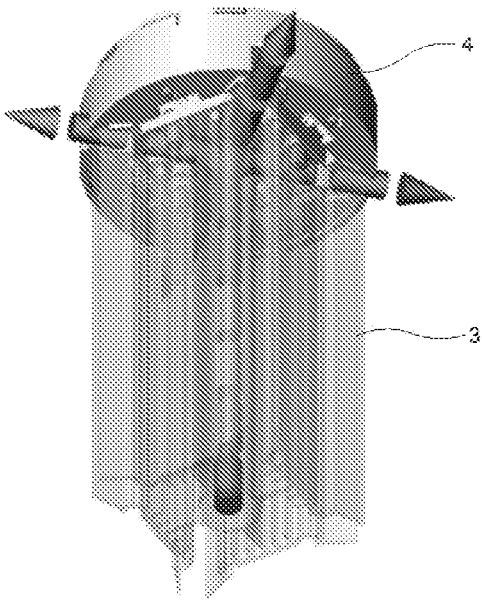
FIG. 16(a) is a view illustrating the heat dissipation structure of the heat-dissipating frame and heat sink of FIG. 9.
Figure 16B:
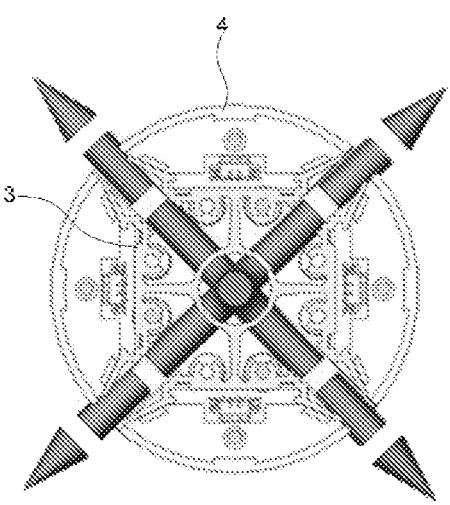
FIG. 16(b) is a view illustrating another example of FIG. 16(a).

FIG. 15 is a top view illustrating the heat dissipation structure of the heat-dissipating frame of FIG. 10; FIG. 16($a$) is a view illustrating the heat dissipation structure of the heat-dissipating frame and heat sink of FIG. 9; and FIG. 16($b$) is a view illustrating another example of FIG. 16($a$).

As shown in FIG. 15, in the heat-dissipating frame 3, heat generated from the LED module of the second LED substrate is transmitted through the substrate contact surface→the auxiliary heat sink and the heat-dissipating wall→the extension and the through-hole portion. At this time, the substrate contact surface of the heat-dissipating frame 3 is formed in a large area while the through-hole portion is formed in the frame, and a passage hole is formed in each extension, thereby maximizing the heat dissipation area of the frame. In addition, the auxiliary heat sink made of the carbon nanotube-based heat-dissipating material is disposed inside each substrate contact surface, so that the heat dissipation efficiency can further be increased.

At this time, hot air which is discharged into the through-hole portion is rapidly heat-exchanged by natural convection in the through-hole, and hot air which is discharged to the outside of the through-hole portion is rapidly discharged externally through the passage holes of the extensions without remaining in the internal space. Thus, the heat generated from the LED can be effectively dissipated.

As shown in FIGS. 16($a$) and 16($b$), in the heat sink 4 coupled to the lower end of the heat-dissipating frame 3, discharge grooves are formed on the upper side of the heat sink. Thus, air introduced through the through-hole and internal space of the heat-dissipating frame 3 can be rapidly discharged externally.

FIG. 17 is a view illustrating a power supply device which is placed in the base of FIG. 9.

As shown in FIG. 17, a power supply device 20 of the present invention comprises: a main power supply module 21; an auxiliary power supply module 23 connected to the main power supply module 21 and configured to auxiliary power; and a connector 25 connected therebetween. The auxiliary power supply module 23 is connected electrically to the output end of the main power supply module 21 and configured to supply power the LED substrates 6 and 8 by a switching operation.

In addition, the auxiliary power supply module 23 is connected in parallel between the output end of the main power supply module 21 and the LED substrates 6 and 8. When the measurement value of a ripple detected from the output end of the main power supply module is higher than a preset reference value, the auxiliary power supply module may output a ripple-free voltage to the LED substrates, thereby preventing power supply from being abnormally performed due to damage to electrolytic capacitors caused by ripple generation in the main power supply module 23.

Furthermore, the connector 25 is provided for electrical connection or isolation between the main power supply module 21 and the auxiliary power supply module 23.

Namely, the auxiliary power supply module 23 is configured to be connected to or separated from the main power supply module 21 through the connector 25. For this reason, when the auxiliary power supply module 23 has broken down or has trouble, the connector 25 is separated from the main power supply module 21, so that only the auxiliary power supply module 23 can be replaced without replacing both the main power supply module 21 and the auxiliary power supply module, and thus the time required for the replacement operation can be reduced.

As described above, according to the LED lighting device 1 according to one embodiment of the present invention, the thermal conductivity, heat release rate and heat release efficiency may be significantly increased by replacing the material of the heat sink and the auxiliary heat sinks with the carbon nanotube-based heat-dissipating material, not conventional aluminum.

Furthermore, according to the LED lighting device 1 of the present invention, the carbon nanotube-based heat-dissipating material is prepared by crushing a highly thermally conductive carbon composite material and metal powder into fine particles and mixing them through a first ball milling step and a second ball milling step and ensuring the dispersibility of the carbon composite material through a dispersion step, and thus may have higher thermal conductivity than conventional aluminum and, at the same time, may induce lightweight production by reducing volume and weight and may reduce the production cost.

In addition, according to the LED lighting device 1 of the present invention, the heat dissipation area of the frame body can be maximized through structural modification, and at the same time, natural convection can be induced, thereby efficiently dissipating the heat generated from LED modules.

In addition, the LED lighting device 1 of the present invention is configured such that the auxiliary heat sinks made of the carbon nanotube-based heat-dissipating material are attachable to and detachable from the inner side of the frame body, and thus the heat dissipation effect can be maintained over a long period of time by simply replacing only the auxiliary heat sinks without disassembling other components.

Furthermore, according to the LED lighting device 1 of the present invention, the uniformity of light can be improved by forming a front diffusion cover into a curved surface.

In addition, according to the LED lighting device 1 of the present invention, the heat dissipation effect may further be improved by forming discharge grooves on the upper side of the heat sink so as to extend to the outer side.

Although the preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An LED lighting device comprising second LED substrates and a heat-dissipating frame, wherein the heat-dissipating frame comprises:
 a frame body formed in a polygonal column shape being open at its upper and lower ends, in which substrate contact surfaces, with which the second LED substrates respectively come into contact, are formed on outer sides of the frame body; and
 auxiliary heat sinks made of a carbon nanotube-based heat-dissipating material and attachably and detachably provided on inner sides corresponding to the substrate contact surfaces of the frame body.

2. The LED lighting device of claim 1, wherein the frame body further comprises:
 a through-hole portion formed in a cylindrical shape being open at its upper and lower end and having a through-hole formed therein, the through-hole portion being formed vertically in the center of the internal space of the frame body; and
 reinforcing walls connecting each inner side of the frame body to the outer circumferential surface of the through-hole portion and extending vertically,
 wherein an 'U'-shaped heat-dissipating wing that extends vertically is formed to protrude on one side of the auxiliary heat sinks, which faces toward the through-hole portion when assembled.

3. The LED lighting device of claim 2, wherein auxiliary heat sink insertion grooves are formed on each inner side of the frame body such that they are formed outward from the inner side, extend to the upper end and lower end of the frame body, and are opposite to each other in the widthwise direction;
 the auxiliary heat sink insertion grooves of the frame body are formed outward from the inner side of the frame body such that the ends thereof extend so as to form extension grooves; and
 each of the auxiliary heat sinks comprises:
 a fixing member formed in a bar shape having a length such that the heat-dissipating wing is formed to protrude on one side of the fixing member and the fixing member is slidably inserted into the auxiliary heat sink insertion groove of the frame body in an up-to-down direction when assembled; and
 insertion members extending laterally from both sides adjacent from the other side of the fixing member and configured to be inserted into the respective extension grooves of the auxiliary heat sink insertion grooves of the frame body.

4. The LED lighting device of claim 3, wherein the LED lighting device further comprises:
 a heat sink coupled to the lower end of the frame body at its upper side and configured to dissipate heat; and
 a base coupled to the lower end of the heat sink,
 wherein the heat sink has a plurality of discharge grooves formed on the upper side thereof, the discharge grooves being formed inward from the upper side and extending to the outer lateral surface.

5. The LED lighting device of claim 4, wherein the heat sink and the auxiliary heat sinks are made of a carbon nanotube-based heat-dissipating material, and a method for preparing the carbon nanotube-based heat-dissipating material comprises:
 a stirring step of stirring 70 to 90 wt % of metal powder and 10 to 30 wt % of a carbon composite material;
 a ball milling step of mixing the metal powder and carbon composite material, stirred in the stirring step, with an organic solvent, followed by ball milling; and
 a heat treatment and dispersion step of mixing a crushed material comprising fine particles, obtained in the ball milling step, with polyethylene glycol (PEG) and a polyester-based binder, thus obtaining a mixture, and blending the mixture while heating, thereby preparing the heat-dissipating material,
 wherein the ball milling step comprises:
 a first ball milling step of supplying the metal powder and carbon composite material, stirred in the stirring step, to a ball mill jar containing balls, followed by rotation at a speed of 200 to 250 rpm, thereby crushing the stirred metal powder and carbon composite material; and
 a second ball milling step of further crushing the crushed material, obtained in the first ball milling step, by rotation at a speed of 200 to 250 rpm by use of balls having a smaller diameter than the balls used in the first ball milling step, wherein the first ball milling step and the second ball milling step comprise mixing 15 to 20 wt % of the mixture of the metal powder and the carbon composite mixture and 80 to 85 wt % of an organic solvent, followed by milling, and stearic acid for promoting dispersion of the carbon composite material is added in an amount of 1.5 to 2.5 wt % based on the total weight in the ball milling step.

6. The LED lighting device of claim 5, wherein the heat treatment and dispersion step comprises heating the polyethylene glycol (PEG) while rotating it at a speed of 50 to 70 rpm for a predetermined time, and adding the crushed material and the polyester-based binder to the heated polyethylene glycol (PEG), and then heating the mixture while rotating it;

the heating temperature in the heat treatment and dispersion step is the melting temperature of the polyethylene glycol (PEG), and the volume fraction of the polyethylene glycol (PEG) and the metal powder is 4, and the volume fraction of the carbon composite material-PEG precursor is 6;

the first ball milling step comprises performing a process for a time period of 1 hour, and then stopping the process for 30 minutes, and the process that is performed for a time period of 1 hour is repeated four times, and the second ball milling step comprises performing a milling process for about 3 to 5 hours.

7. The LED lighting device of claim 6, wherein the carbon composite material is single-walled carbon nanotubes (SW-CNTs), double-walled carbon nanotubes (DWCNTs), multi-walled carbon nanotubes (MWCNTs), rope carbon nanotubes, or a combination thereof, and the polyethylene glycol that is used in the heat treatment and dispersion step has a molecular weight of 15,000 to 20,000.

8. The LED lighting device of claim 4, wherein passage holes are respectively formed in extensions between the adjacent substrate contact surfaces of the frame body such that they are formed inward from the outer side and connected to the internal space of the frame body;

the passage holes are formed such that they are connected to each of the adjacent substrate contact surfaces and extend vertically to the upper end and lower end of the frame body, and thus the adjacent substrate contact surfaces are spaced apart from each other by the passage holes; and plate-shaped auxiliary extensions are formed to protrude in each extension of the frame body such that they protrude outward from the lateral side of each of the adjacent substrate contact surfaces, extend vertically, and are spaced apart from each other so as to externally expose the corresponding passage hole.

9. The LED lighting device of claim 4, wherein at least one bolt hole is formed in the fixing member;

a bolt groove corresponding to the bolt hole of the auxiliary heat sink is formed on the inner sides of the frame body, and thus the frame body and the auxiliary heat sink are fixed by bolt locking;

sliding grooves are formed on both sides of the substrate contact surfaces of the frame body such that both sides of the second LED substrates are slidably inserted therein;

the LED lighting device further comprises second diffusion covers configured to emit light from the second LED substrate, which are inserted in the sliding grooves of the substrate contact surfaces and come in contact with the substrate contact surfaces;

the LED lighting device further comprises a power supply device placed in the base;

the power supply device comprises a main power supply module configured to supply power to the second LED substrates, and an auxiliary power supply module separably connected to the main power supply module by a connector;

the auxiliary power supply module is connected in parallel between the output end of the main power supply model and the second LED substrates, and configured to detect ripple of the main power supply module and remove the rippled from the output voltage when the detected ripple is higher than a predetermined reference value;

the LED lighting device comprises a first LED substrate disposed on the upper end of the frame body, and a front diffusion cover configured to emit light emitted the first LED substrate; and the front diffusion cover is formed in a spherical shape being open at one side.

10. The LED lighting device of claim 6, wherein passage holes are respectively formed in extensions between the adjacent substrate contact surfaces of the frame body such that they are formed inward from the outer side and connected to the internal space of the frame body;

the passage holes are formed such that they are connected to each of the adjacent substrate contact surfaces and extend vertically to the upper end and lower end of the frame body, and thus the adjacent substrate contact surfaces are spaced apart from each other by the passage holes; and plate-shaped auxiliary extensions are formed to protrude in each extension of the frame body such that they protrude outward from the lateral side of each of the adjacent substrate contact surfaces, extend vertically, and are spaced apart from each other so as to externally expose the corresponding passage hole.

* * * * *